(12) United States Patent
Michael et al.

(10) Patent No.: US 6,323,095 B1
(45) Date of Patent: Nov. 27, 2001

(54) METHOD FOR REDUCING JUNCTION CAPACITANCE USING A HALO IMPLANT PHOTOMASK

(75) Inventors: Mark W. Michael, Cedar Park; Jon D. Cheek, Round Rock; Robert Dawson, Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/489,178

(22) Filed: Jan. 21, 2000

(51) Int. Cl.$^7$ .......................... H01L 21/336; H01L 29/78
(52) U.S. Cl. .......................... 438/305; 438/299; 438/301; 438/303
(58) Field of Search ...................................... 438/305, 163, 438/180, 181, 184, 185, 301, 303, 299

(56) References Cited

U.S. PATENT DOCUMENTS

| 5,504,023 | 4/1996 | Hong | 437/44 |
| 5,963,811 | 10/1999 | Chern | 438/289 |
| 5,976,937 | 11/1999 | Rodder et al. | 438/275 |

FOREIGN PATENT DOCUMENTS

| 0535917A2 | 4/1993 | (EP). |
| 0535917A3 | 6/1996 | (EP). |

OTHER PUBLICATIONS

International Search Report for International Application Serial No. PCT/US00/24422 Filed Sep. 6, 2000.

*Primary Examiner*—Richard Elms
*Assistant Examiner*—Beth E. Owens
(74) *Attorney, Agent, or Firm*—Williams, Morgan & Amerson, P.C.

(57) ABSTRACT

A method for forming a semiconductor device is provided. The method includes providing a substrate having a gate formed thereon. A first doped region is formed in the substrate. The first doped region extends a first distance from the gate. A second doped region is formed in the substrate. The second doped region extends a second distance from the gate. The first distance is less than the second distance. A semiconductor device includes a substrate, isolation structures defined in the substrate, and a gate disposed on the substrate between adjacent isolation structures. A first doped region is defined in the substrate proximate the gate. The first doped region extends a first distance from the gate. A second doped region is defined in the substrate proximate the gate. The second doped region extends a second distance from the gate. The first distance is less than the first distance.

33 Claims, 4 Drawing Sheets

METHOD FOR REDUCING JUNCTION CAPACITANCE USING A HALO IMPLANT PHOTOMASK

BACKGROUND OF THE INVENTION

1. Field of the Invention

This invention relates generally to the field of semiconductor processing, and, more particularly, to a method for reducing junction capacitance using a halo implant photomask.

2. Description of the Related Art

Semiconductor devices, such as transistors, are formed through a series of steps. First a gate is formed over a portion of a substrate. Implants are then conducted to form source/drain (S/D) regions of the transistor. In an N type transistor, N type dopants are implanted in a P type substrate. In a P type transistor, an N type well is typically formed in a portion of the substrate, and the gate is formed over a portion of the N type well. P type dopants are then implanted to form the S/D regions.

Typically, several implantation steps are used to form the transistor. In the following discussion, fabrication of an N type transistor is described. First, a lightly doped drain (LDD) implant is performed using an N type dopant, such as Arsenic. Next, a halo implant is performed using a P type dopant, such as Boron. The halo implant is used to reduce short channel effects associated with the transistor. Short channel effects cause the threshold voltage of the transistor to decrease as the geometry shrinks. Typically, at least a portion of the halo implant is performed at an angle so that some of the dopant is implanted beneath the gate. Following the halo implant, spacers are formed on the gate, and a S/D implant is performed with an N type dopant, such as Phosphorous.

One disadvantage of using a halo implant to reduce the short channel effects is that the presence of the P type halo dopant in the N type S/D regions increases the junction capacitance of the transistor. Increased junction capacitance results in a less efficient transistor.

The present invention is directed to overcoming, or at least reducing the effects of, one or more of the problems set forth above.

SUMMARY OF THE INVENTION

One aspect of the present invention is seen in a method for forming a semiconductor device. The method includes providing a substrate having a gate formed thereon. A first doped region is formed in the substrate. The first doped region extends a first distance from the gate. A second doped region is formed in the substrate. The second doped region extends a second distance from the gate. The first distance is less than the second distance.

Another aspect of the present invention is seen in a semiconductor device including a substrate, isolation structures defined in the substrate, and a gate disposed on the substrate between adjacent isolation structures. A first doped region is defined in the substrate proximate the gate. The first doped region extends a first distance from the gate. A second doped region is defined in the substrate proximate the gate. The second doped region extends a second distance from the gate. The first distance is less than the first distance.

BRIEF DESCRIPTION OF THE DRAWINGS

The invention may be understood by reference to the following description taken in conjunction with the accompanying drawings, in which like reference numerals identify like elements, and in which.

Figure 1:
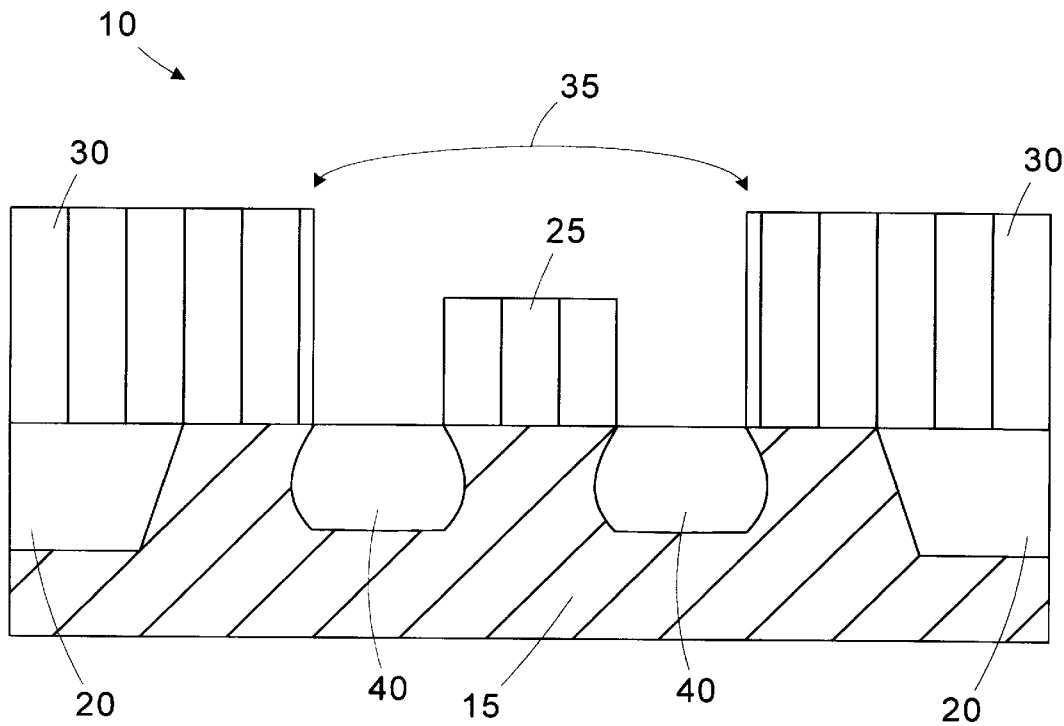
FIG. 1 is a cross section of a semiconductor device after a halo implant has been performed using a halo implant photomask.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, a process for forming a semiconductor device 10 in accordance with the present invention is shown. In the following illustration, steps used to form an N type device, such as a transistor, are described; however, it will be appreciated by those of ordinary skill in the art, that similar steps using complimentary dopants may be used to define a P type device.

FIG. 1 illustrates a cross section of the semiconductor device 10. The device 10 includes a substrate 15 (e.g., P type) with isolation structures 20 formed therein. In the illustrated embodiment, the isolation structures 20 are shallow trench isolation (STI) structures, but other isolation structures 20, such as local oxidation of silicon (LOCOS) structures may be used. A gate 25 is formed on the substrate 15. For clarity, not all features of the gate 25 are shown. Typically, the gate 25 includes a gate oxide layer formed over the substrate 15, a conductive layer over the gate oxide, and an insulative layer over the conductive layer. The conductive and insulative layers may each include more than one layer. For example, the conductive layer may include a polysilicon layer covered by a silicide layer, and the insulative layer may include an oxide layer covered by a nitride cap layer. Various gate 25 embodiments may be used, and their specific constructs are well known to those of ordinary skill in the art.

A photoresist layer 30 is deposited and patterned to define a halo opening 35, exposing the substrate proximate the gate 25. The halo opening has a width less than the distance between the isolation structures 20. A halo implant is performed using a P type dopant (e.g., boron or $BF_2$) to form halo regions 40. The halo implant may be conducted using a series of implants at angles from 0° to 30° from vertical. Such an angled implant drives some of the P type halo dopant beneath the gate 25, enhancing its ability to reduce short channel effects. Because the halo opening 35 is narrower than the width between the isolation structures 20, the P type dopant is concentrated nearer the gate 25 than the isolation structures 20.

Figure 2:
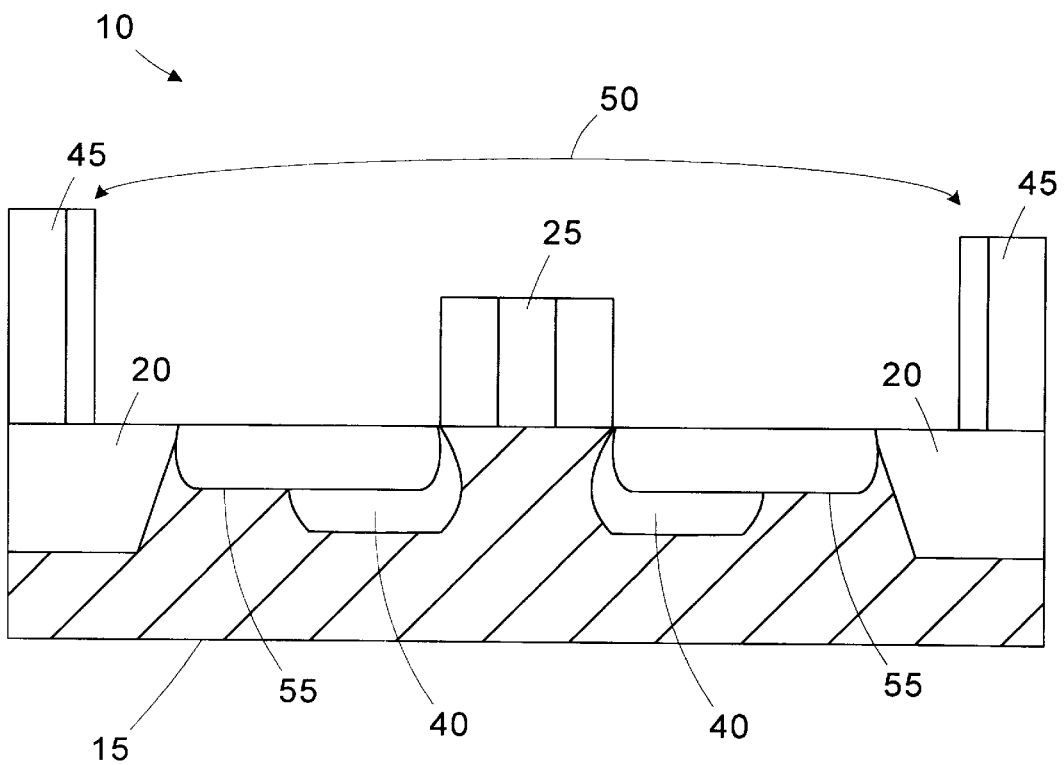
FIG. 2 is a cross section of the device of FIG. 1 after a lightly doped drain implant has been performed using a source/drain photomask.

Turning now to FIG. 2, the photoresist layer 30 is removed and a second photoresist layer 45 is deposited and patterned to form a source/drain opening 50. A lightly doped drain implant is performed through the source/drain opening using an N type dopant (e.g., arsenic or phosphorous) to form LDD regions 55.

Figure 3:
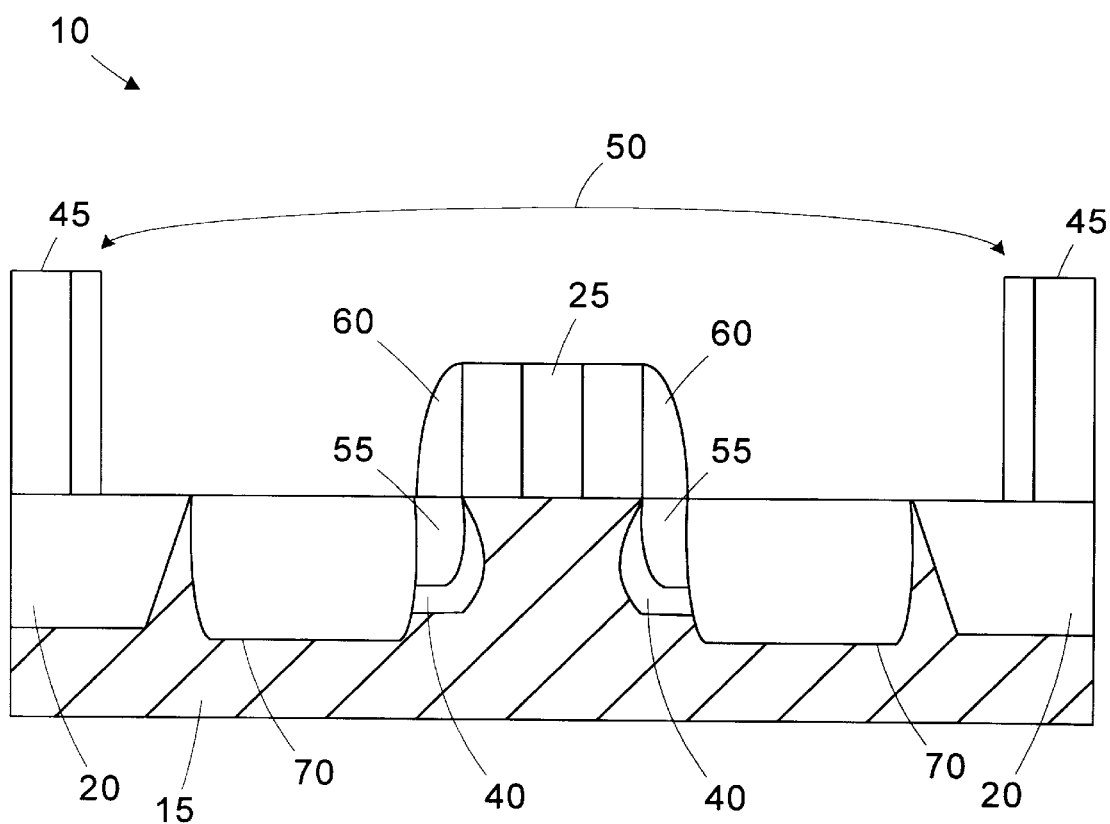
FIG. 3 is a cross-section of the device of FIG. 2 after spacers have been formed and a source/drain implant has been performed through the source/drain photomask.

Referring now to FIG. 3, spacers 60 are formed about the gate 25 using processes well known to those of ordinary skill in the art. Subsequently, a source/drain implant is performed through the source/drain opening 50 using an N type dopant (e.g., phosphorous or arsenic) to define source/drain regions 70.

Figure 4:
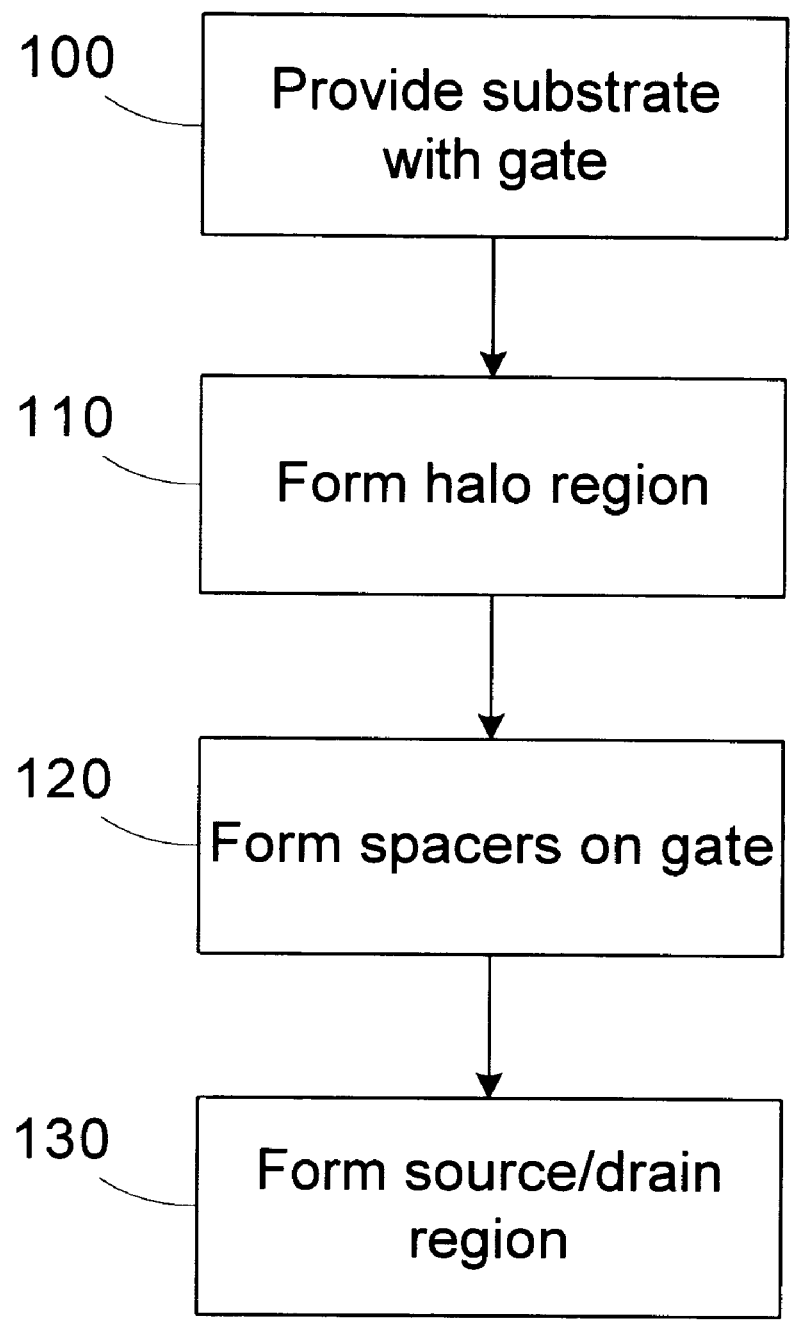
FIG. 4 is a flow diagram of a first method for forming a semiconductor device in accordance with the present invention.

The method for forming the semiconductor device 10 described above is summarized in FIG. 4. In block 100, a substrate having a gate formed thereon is provided. A halo region is formed in the substrate in block 110. The halo region extends a first distance from the gate. In block 120, spacers are formed on the gate. A source/drain region extending a second distance from the gate is formed in the substrate in block 130. The first distance is less than the second distance (i.e., the halo region is narrower than the source/drain region).

Figure 5:
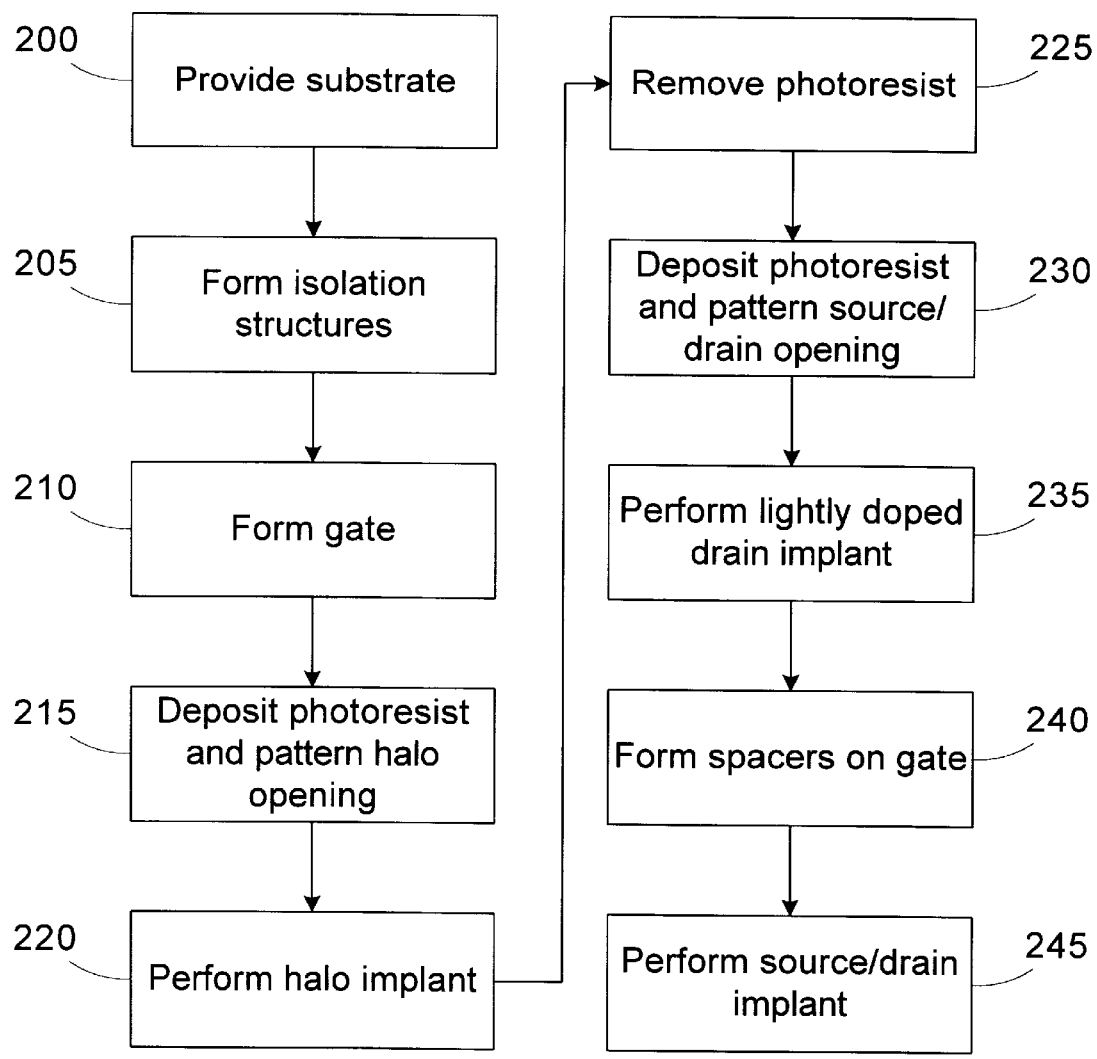
FIG. 5 is a flow diagram of a second method for forming a semiconductor device in accordance with the present invention.

A more detailed flow diagram of a method for forming a semiconductor device 10 in accordance with the present invention is shown in FIG. 5. A substrate is provided (block 200). Isolation structures are formed on the substrate (block 205), and a gate is formed on the substrate between adjacent isolation structures (block 210). A first photoresist layer is deposited and patterned to define a halo opening proximate the gate (block 215). A halo implant is conducted through the halo opening to form halo regions (block 220). The photoresist layer is removed (block 225), and a second photoresist layer is deposited and patterned to define a source/drain opening proximate the gate, but wider than the halo opening (block 230). A lightly doped drain (LDD) implant is conducted through the source/drain opening to form LDD regions (block 235). Spacers are formed on the gate (block 240), and a source/drain implant is conducted through the halo opening to form source/drain regions (block 245).

Returning to FIGS. 1–3, because the halo opening 35 is narrower than the source/drain opening 50, the P type dopant is concentrated nearer the gate 25 than the isolation structure 20. Because the background P type dopant level resulting from the halo region 40 is reduced in the LDD region 55 and the source/drain region 70, the junction capacitance of the semiconductor device 10 is likewise reduced.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, comprising:

providing a substrate having a gate formed thereon;

forming a first doped region in the substrate, the first doped region extending a first distance from the gate;

forming a photoresist layer on the substrate;

patterning the photoresist layer to define an opening, the opening extending a second distance from the gate; and implanting a second dopant into the substrate through the opening to form a second doped region in the substrate, the second doped region extending the second distance from the gate, the first distance being less than the second distance.

2. The method of claim 1, further comprising forming spacers on the gate prior to forming the second doped region.

3. The method of claim 1, wherein forming the first doped region includes:

forming a photoresist layer on the substrate;

patterning the photoresist layer to define a first opening, the first opening extending the first distance from the gate; and implanting a first dopant into the substrate through the first opening.

4. The method of claim 3, wherein the first dopant comprises a P type dopant.

5. The method of claim 4, wherein the P type dopant comprises at least one of boron and $BF_2$.

6. The method of claim 3, wherein the second dopant comprises an N type dopant.

7. The method of claim 4, wherein the N type dopant comprises at least one of phosphorous and arsenic.

8. The method of claim 1, further comprising forming a third doped region in the substrate, the third doped region extending the second distance from the gate.

9. The method of claim 8, wherein the third doped region is formed prior to forming the second doped region.

10. The method of claim 8, wherein forming the third doped region includes implanting a third dopant into the substrate through the second opening.

11. The method of claim 10, wherein the third dopant comprises an N type dopant.

12. The method of claim 11, wherein the N type dopant comprises at least one of arsenic and phosphorous.

13. The method of claim 1, wherein forming the first doped region includes forming the first doped region using a first dopant of a first type and forming the second doped region includes forming the second doped region using a second dopant of a second type, the first type being different than the second type.

14. The method of claim 13, wherein the first dopant comprises a P type dopant and the second dopant comprises an N type dopant.

15. The method of claim 13, wherein the first dopant comprises at least one of boron and $BF_2$, and the second dopant comprises at least one of phosphorous and arsenic.

16. The method of claim 1, wherein forming the first doped region comprises forming a halo region.

17. The method of claim 1, wherein forming the second doped region comprises forming a source/drain region.

18. The method of claim 8, wherein forming the third doped region comprises forming a lightly doped drain region.

19. A method for forming a semiconductor device, comprising:

providing a substrate;

forming isolation structures on the substrate;

forming a gate on the substrate between adjacent isolation structures;

depositing and patterning a first photoresist layer on the substrate to define a first opening proximate the gate;

implanting a first dopant through the first opening to form a first doped region in the substrate;

removing the first photoresist layer;

depositing and patterning a second photoresist layer on the substrate to define a second opening proximate the gate, the second opening being wider than the first opening; and implanting a second dopant through the second opening to form a second doped region in the substrate.

20. The method of claim 19, further comprising forming spacers on the gate prior to implanting the second dopant.

21. The method of claim 19, wherein the first dopant comprises a P type dopant.

22. The method of claim 21, wherein the P type dopant comprises at least one of boron and $BF_2$.

23. The method of claim 19, wherein the second dopant comprises an N type dopant.

24. The method of claim 23, wherein the N type dopant comprises at least one of phosphorous and arsenic.

25. The method of claim 19, further comprising implanting a third dopant through the third opening to form a third doped region in the substrate.

26. The method of claim 25, wherein the third dopant comprises an N type dopant.

27. The method of claim 26, wherein the N type dopant comprises at least one of arsenic and phosphorous.

28. The method of claim 19, wherein the first dopant is of a first type and the second is of a second type, the first type being different from the second type.

29. The method of claim 28, wherein the first dopant comprises a P type dopant and the second dopant comprises an N type dopant.

30. The method of claim 28, wherein the first dopant comprises at least one of boron and $BF_2$, and the second dopant comprises at least one of phosphorous and arsenic.

31. The method of claim 9, wherein forming the first doped region comprises forming a halo region.

32. The method of claim 9, wherein forming the second doped region comprises forming a source/drain region.

33. The method of claim 25, wherein forming the third doped region comprises forming a lightly doped drain region.

* * * * *